United States Patent
Russell et al.

(12)

(10) Patent No.: US 6,277,250 B1
(45) Date of Patent: Aug. 21, 2001

(54) DUAL CATHODE ARRANGEMENT FOR PHYSICAL VAPOR DEPOSITION OF MATERIALS ONTO A ROUND SUBSTRATE WITH HIGH ASPECT RATIO FEATURES

(75) Inventors: Derrek A. Russell, Scottsdale; Mirko Vukovic, Gilbert, both of AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/692,683

(22) Filed: Oct. 19, 2000

(51) Int. Cl.[7] .................................................... C23C 14/34
(52) U.S. Cl. ........................ 204/192.12; 204/298.16; 204/298.26; 204/192.12; 204/298.21
(58) Field of Search ..................... 204/298.12, 298.13, 204/298.18, 298.16, 298.26, 298.21, 192.12

(56) References Cited

U.S. PATENT DOCUMENTS 5,919,345   7/1999   Tepman .

FOREIGN PATENT DOCUMENTS 0 150 482   * 9/1981   (DE) ................................ 204/298.12
0 239 807-A1 * 10/1986   (DE) ................................ 204/298.12

* cited by examiner

Primary Examiner—Nam Nguyen
Assistant Examiner—Gregg Cantelmo
(74) Attorney, Agent, or Firm—Wood, Herron & Evans, LLP (57) ABSTRACT

A cathode arrangement for physical vapor deposition onto substrates with high aspect ratio features for achieving high flat-field uniformity. The cathode arrangement includes two cathodes, a planar cathode and a conical cathode, where the conical cathode is truncated to provide an orifice in which the planar cathode is oriented. The angular distributions of sputtered atoms from the two cathodes complement one another to provide more uniform deposition.

42 Claims, 4 Drawing Sheets

DUAL CATHODE ARRANGEMENT FOR PHYSICAL VAPOR DEPOSITION OF MATERIALS ONTO A ROUND SUBSTRATE WITH HIGH ASPECT RATIO FEATURES

FIELD OF THE INVENTION

This invention relates generally to an apparatus for physical vapor deposition of materials onto substrates having high aspect ratio features, and more particularly to a sputter target arrangement for improved deposition.

BACKGROUND OF THE INVENTION

Traditional flat-field physical vapor deposition (PVD) of materials onto substrates containing high aspect ratio features, for example greater than 1:1, exhibits poor bottom and side-wall coverage, as well as void formation, in these features due to the wide angular distribution of the atoms being deposited from the sputter target onto the substrate, for example up to 90 degrees from the surface normal. This wide angular distribution occurs because the requirements of high deposition utilization, defined as the percentage of sputtered atoms deposited on the substrate, and good flat-field uniformity have traditionally necessitated a very short, i.e., less than one-third of the substrate diameter, target to substrate distance, also known as the throw distance. This short throw distance means that the solid angle subtended by the sputter target, at a given point on the substrate, can approach $2\pi$ steradians. In other words, a point on the substrate "perceives" a target of infinite two-dimensional extent. While this is acceptable for depositing a blanket of material onto a flat field, it is highly undesirable for coating patterned substrates having high aspect ratio features due to shadowing of the incoming flux of atoms by the feature.

One method of narrowing the angular distribution of arriving atoms on the patterned substrate is to increase the throw distance. A conventional "long throw" PVD arrangement consists of a single planar cathode (sputter target) of larger diameter than the substrate having a throw distance greater than one substrate diameter. This arrangement is effective in decreasing the solid angle subtended by the target at every point on the substrate. However, for targets comparable in diameter to the substrate, achieving acceptable flat-field uniformity, for example less than 3% non-uniformity at one standard deviation, is only possible at an extremely large throw distance, for example $\geq 2$ substrate diameters. Unfortunately, the deposition utilization is only several percent at these large throw distances, which is not practical for mass production applications. In addition, collisions of sputtered atoms with the ambient gas atoms/molecules between the target and substrate results in a broadening of the angular distribution of the sputtered atoms, which tends to defeat the purpose of a long throw distance. For these reasons, single planar target long throw techniques are limited to a range of throw distance that results in either unacceptably low flat-field uniformity or unacceptably low deposition utilization, or both.

Another drawback of long throw techniques is side-wall asymmetry, also known as inboard-outboard asymmetry. This means that one side of a feature is more heavily coated than the other side. This effect is a result of the fact that an off-center point on the substrate is bombarded by more atoms incident from the inboard side of the feature than the outboard side, assuming the center axes of the target and substrate are collinear. This asymmetry is usually most pronounced at the edge of the substrate. Increasing the target diameter does improve the asymmetry, but at the expense of broadening the angular distribution of the arriving atoms. This broadened angular distribution occurs because increasing the target diameter is geometrically equivalent to decreasing the throw distance.

Thus, the conventional "long throw" PVD technique utilizing a single planar cathode can effectively coat high aspect ratio features, but unfortunately with low flat-field uniformity and deposition utilization. To make the concept of "long throw" PVD practical, another technique is needed to provide a directional sputtered flux of atoms while still providing acceptable flat-field uniformity and deposition utilization.

In addition to the single planar cathode arrangement, other arrangements have been proposed for altering angular distribution, for example, U.S. Pat. No. 5,919,345. In this reference, it is proposed to provide a single non-planar convex or concave conical target. However, none of the proposed arrangements have proven satisfactory in achieving high flat-field uniformity and high deposition utilization.

There is thus a need for a PVD arrangement that provides an angular distribution of sputtered atoms that deposit with acceptable flat-field uniformity and deposition utilization.

SUMMARY OF THE INVENTION

The present invention provides a dual cathode arrangement for physical vapor deposition of material onto substrates having high aspect ratio features. The cathode arrangement includes a planar target positioned within an orifice of a truncated conical target, whereby the distribution of atoms sputtered from each target complement each other to provide high flat-field uniformity of deposited material onto the substrate with high deposition utilization.

The present invention shall become more apparent from the accompanying drawings and description thereof.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION

An apparatus is provided for physical vapor deposition of materials onto round substrates containing large aspect ratio features with superior deposition utilization and flat-field uniformity to that of conventional "long throw" sputtering arrangements consisting of single planar cathodes. To this end, and in accordance with the principles of the present invention, a dual cathode arrangement is provided comprising a round planar cathode (target) inside the orifice of an outwardly directed truncated conical cathode (target). The dual cathode arrangement of the present invention utilizes the cosine-like distribution of atoms sputtered from the surface of the conical target to reduce the angular distribution of atoms arriving on the substrate. This is in contrast to conventional "long throw" arrangements that utilize very large target to substrate distances to produce similar angular distribution.

Figure 1:
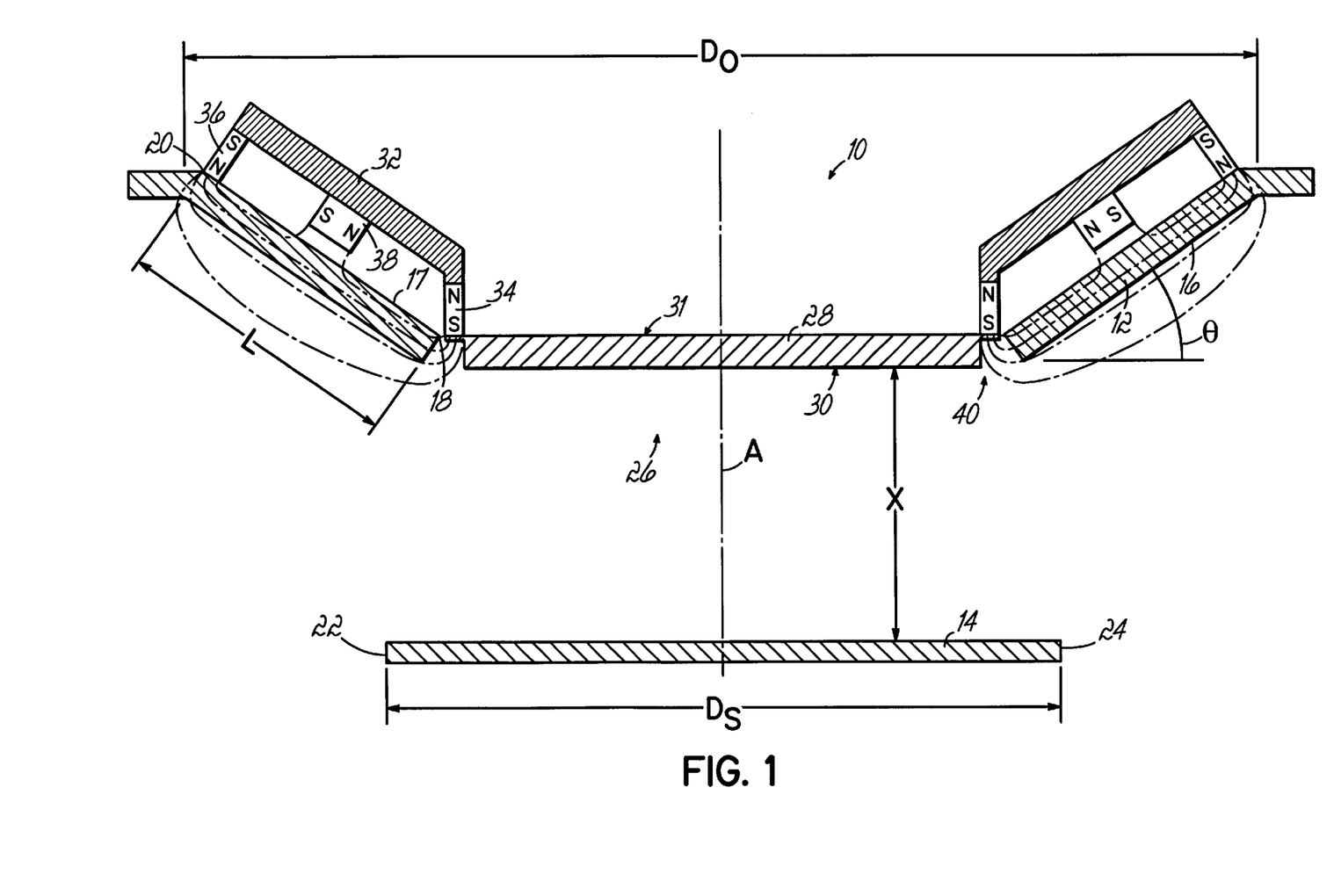
FIG. 1 is a cross-sectional view of an embodiment of a dual cathode PVD arrangement of the present invention.

Referring now to the Figures in which like numerals are used throughout for like components, FIG. 1 depicts an embodiment of a dual cathode PVD arrangement of the present invention in cross-sectional view. The arrangement 10 comprises a truncated conical target 12 that is oriented with respect to a substrate 14 such that the two center axes A are collinear. The exterior sputtering surface 16 of the conical target 12 is facing away from the center axes A so that most of the atoms ejected from the sputtering surface 16 are deposited onto the walls of the deposition chamber (not shown). The outer diameter $D_o$ at the non-truncated or outer edge 20 of the conical target 12 is larger than the diameter $D_s$ of the substrate 14 such that the inboard side-walls of features (not shown) near the edges 22,24 of the substrate 14 can be coated. The angle θ of the conical target 12, the length L of the sputtering surface 16 from the truncated or inner edge 18 to the outer edge 20 of the conical target 14, the outer diameter $D_o$, and the throw distance X of the conical target 12 can be optimized for a given substrate diameter $D_s$ and feature geometry. For example, angle θ can be varied depending on the type of angular distribution required, and for example, may be in the range of about 35°–45°. The deposition profile of the conical target 12 across a substrate 14 is "dished", meaning that it is thicker toward the edges 22,24 of the substrate 14 than toward the center of the substrate 14. Because most of the sputtered flux is directed away from the substrate 14, the deposition utilization is much smaller than that of the conventional flat-field PVD arrangement.

Inside the orifice 26 at the inner edge 18 of conical target 12 is a planar target 28, which comprises the same material as the conical target 12. The exterior sputtering surface 30 of the planar target 28 opposes the substrate 14 at a distance X, the throw distance. This planar target 28 functions to complement the deposition profile, angular distribution, and deposition utilization of the conical target 12. The planar target 28 is electrically isolated from the conical target 12 and driven with a separate power supply (not shown). The power density (watts/cm$^2$) of the planar target 28 is substantially smaller, for example by approximately 50%, than the power density of the conical target 12. The deposition profile of the planar target 28 across the substrate 14 is highly "domed", meaning that it is thicker toward the center of the substrate 14 than toward the edges 22,24 of the substrate 14. The power densities of both cathodes 12,28 can be chosen so that the two deposition profiles complement one another and produce exceptional flat-field uniformity, such as less than 1% non-uniformity at one standard deviation. This overcomes a major disadvantage of the conventional long throw scheme, which is poor flat-field uniformity at throw distances that are practical with regard to deposition utilization and angular distribution.

The angular distributions of sputtered atoms originating from the two targets 12,28 also complement one another. Points further from the center of the substrate 14 are regions of larger angle deposition originating from the planar target 28 than are points closer to the center of the substrate 14. Conversely, points further from the center of the substrate 14 are regions of smaller angle deposition originating from the conical target 12 than are points closer to the center of the substrate 14. This complementary angular distribution occurs because one side of the conical target 12 contributes a negligible amount of deposition, if any, to an opposite side of the substrate 14 due to the orientation of the sputtering surface 16 and the cosine-like distribution of sputtered atoms. At a certain radius and beyond, there will be exactly zero contribution from that side of the target 12 to the opposite side of the substrate 14. Because of this effect, each point on the substrate 14 beyond this radius "perceives" a sputtering source of much smaller diameter. Therefore, the main benefit of long throw sputtering, i.e., reduced angular distribution at each point on the substrate 14, can be achieved at a much shorter throw distance X, for example approximately one-half the substrate diameter $D_s$.

This shorter throw distance is important in that collisions of sputtered atoms with ambient gas atoms/molecules will not broaden the angular distribution of sputtered atoms arriving at the substrate 14. This is also important for deposition utilization. The dual cathode arrangement 10 is capable of excellent flat-field uniformity, such as less than about 1% non-uniformity at one standard deviation, at a throw distance X of one-half of a substrate diameter $D_s$, while still achieving respectable deposition utilization on the order of 15%. A conventional "long throw" PVD arrangement would require a throw distance of more than six substrate diameters to achieve this type of uniformity, and the resulting deposition utilization would be less than 2%.

By way of example only, a dual cathode arrangement within the scope of the present invention may have the following parameters: a conical target with an outer diameter $D_o$ of about 16 inches and a face length L of about 4⅜ inches with an angle θ of about 35°; and a planar target with a diameter of about 7.5 inches oriented from a 12 inch target at a throw distance of about 6 inches.

FIG. 1 further shows one possible magnetic arrangement for the dual cathode source 10. The magnetic arrangement consists of a pole piece 32 extending over the interior surface 17 of the conical target 12 and three rows 34,36,38 of magnets. The pole piece 32 is made of a material having high magnetic permeability, such as mild steel. The first row 34 of magnets, or the inner row 34, is located directly behind the interior surface 30 of the planar target 28 adjacent the radially inner truncated edge 18 of the conical target 12 and is oriented with its magnetic moment perpendicular to the exterior sputtering surface 30 of the planar target 28. The purpose of this inner magnet row 34 is to create one edge of the magnetic tunnel over the sputtering surface 16 of the conical target. The second row 36 of magnets, or outer row 36, is located near the outer non-truncated edge 20 of the conical target 12 and is oriented with its magnetic moment perpendicular to the exterior sputtering surface 16 of the conical target 12. The pole orientation of the outer row 36 is opposite to the pole orientation of the inner row 34. The purpose of the outer magnet row 36 is to provide the other edge of the magnetic tunnel that surrounds the conical target 12. The third row 38 of magnets, or the center row 38, is located near the center of the interior surface 17 of the conical target 12 and is oriented with its magnetic moment parallel to the sputtering surface 16 of the conical target 12. The center row 38 may alternatively consist of a material with high magnetic permeability, or two rows of magnets connected together by a material with high magnetic permeability. The magnetic arrangement in FIG. 1 does not create a magnetic tunnel over the planar target 28. Rather, the planar target 28 is operated in diode sputtering mode with the conical target 12 operating concurrently in magnetron mode. Because the total electrical power of the planar target 28 is many times smaller than the electrical power of the conical target 12, the planar target 28 can scavenge ions from the adjacent space.

The function of the magnetic arrangement depicted in the embodiment of FIG. 1 is to enable low-pressure operation of the conical cathode or target 12. This is accomplished by trapping electrons near the surface 16 of the cathode 12 and by confining the plasma away from ground potential. Close proximity of the plasma to ground potential will result in electron losses that will cause the plasma to extinguish. Optimum low-pressure operation may only be achieved by also optimizing the magnitude of the magnetic field.

As is well known to one of ordinary skill in the art, static magnetic arrangements typically result in V-shaped erosion profiles. This shape is the result of curved magnetic flux lines that tend to pinch the plasma into the center of the magnetic tunnel. This type of erosion profile may result in significant shadowing of the sputtered flux from the conical target 12 onto the substrate 14 during the latter portions of target life. The magnetic arrangement depicted in FIG. 1 overcomes this limitation by adding the center row 38 of magnets that acts to flatten the magnetic flux lines so that the target 12 erodes with a flat profile. It should be noted, however, that the magnetic tunnel does not terminate into the conical target 12, but instead, terminates into the planar target 28.

This means that there is a region of negligible erosion intensity, or a "dead space", on the outer edge 40 of the planar target 30. This region is intentionally recessed so that it does not shadow the erosion of the conical target 12. Terminating the magnetic tunnel of the conical target 12 outside the target is possible because it is terminated into another cathode 28. Terminating the tunnel into an object that is electrically grounded would severely diminish the low-pressure performance of the conical cathode 12.

Figure 2:
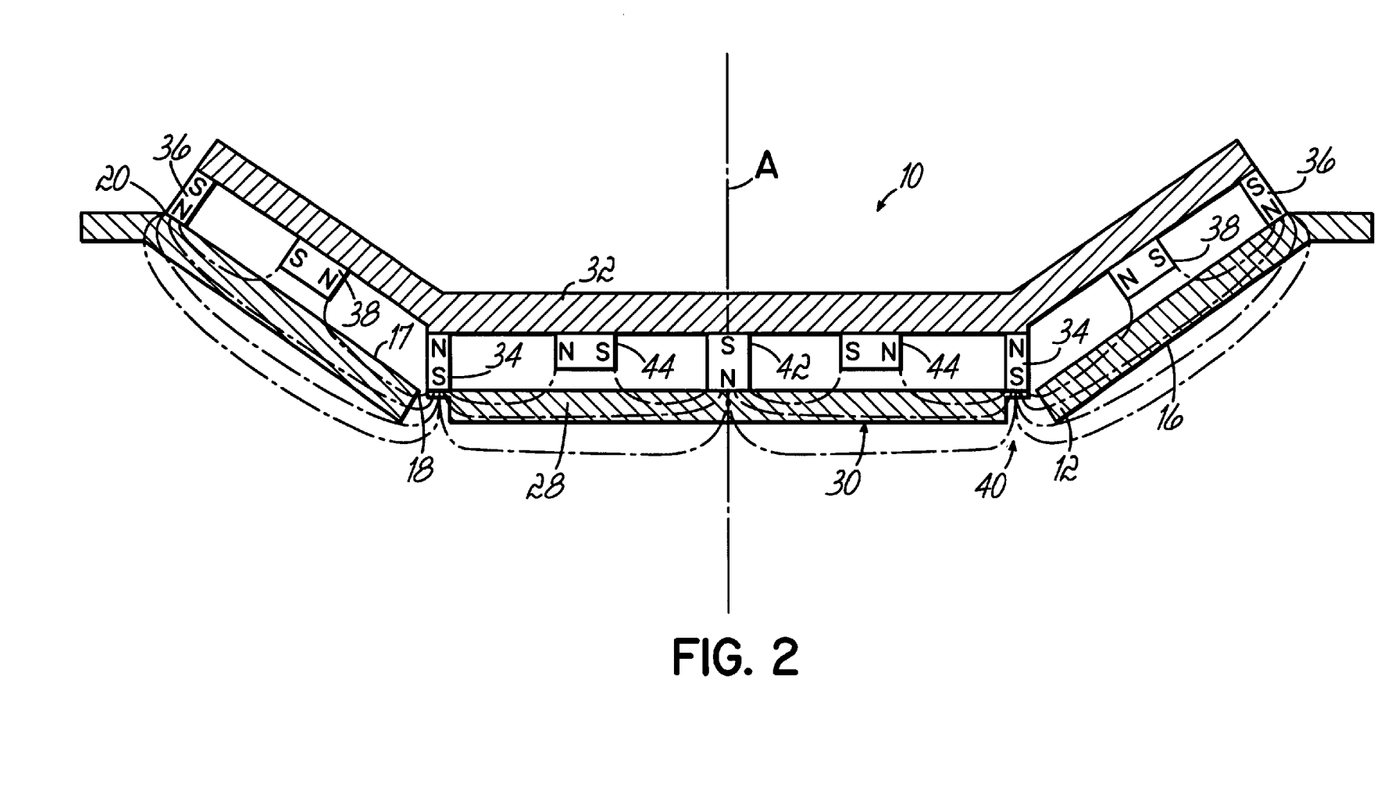
FIG. 2 is another embodiment of a dual cathode PVD arrangement of the present invention having an alternative magnetic arrangement.
Figure 3:
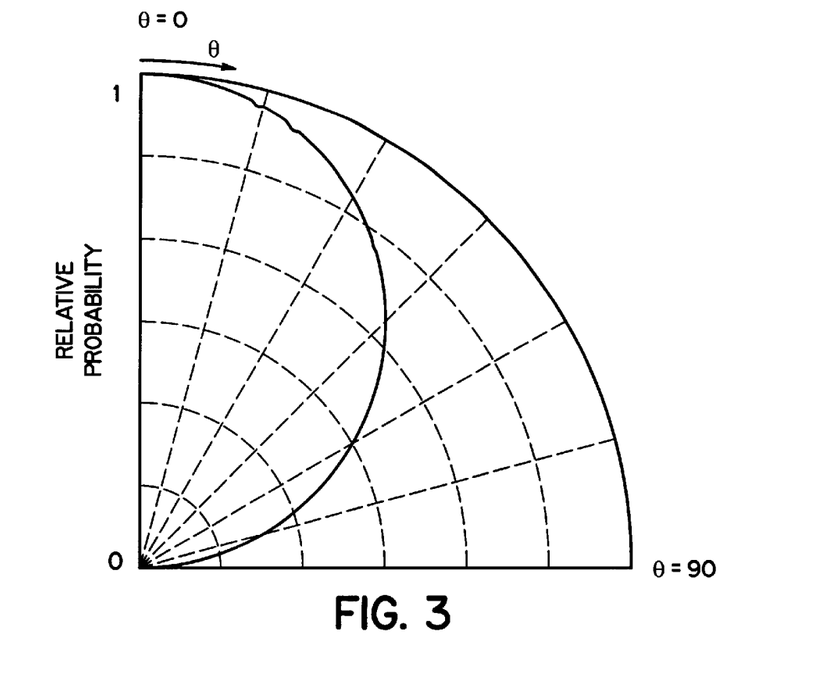
FIG. 3 is a polar plot of the angular distribution of a single planar cathode PVD arrangement of the prior art.

FIG. 2 depicts an alternative embodiment of a magnetic arrangement for the dual cathode source 10 of the present invention, which results in a magnetic tunnel being formed over the planar cathode 28. The magnetic arrangement comprises a pole piece 32 that extends over the entire cathode assembly 10, including the interior surfaces 17,31 of both the conical target 12 and the planar target 30, respectively. Three rows of magnets 34,36,38 are positioned as described in the embodiment depicted in FIG. 1. A fourth magnet 42, a center axis magnet 42, is positioned directly behind the planar target 28 at the center axis A, oriented with its magnetic moment perpendicular to the sputtering surface 30 of the planar target 28, and oriented opposite to the pole orientation of the inner magnet row 34. Thus, a magnetic tunnel is formed over the planar cathode 28. The arrangement may further comprise a fifth row 44 of magnets, an intermediate row 44, to flatten the magnetic flux lines of the magnetic tunnel formed over the planar cathode 28. The intermediate row 44 is positioned between the inner row 34 of magnets and the center axis magnet 42, and is oriented with its magnetic moment parallel to the sputtering surface 30 of the planar target 28. This intermediate row 44 of magnets may alternatively comprise high magnetic permeability material or some combination of magnets and high magnetic permeability material.

Figure 4:
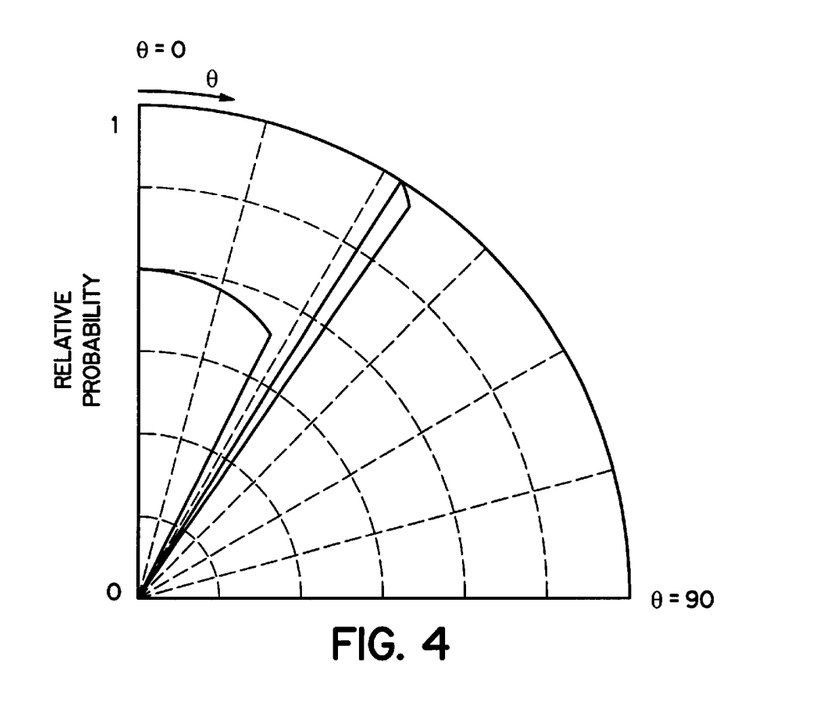
FIG. 4 is a polar plot of the angular distribution of a dual cathode PVD arrangement of the present invention at a radius of 0 cm.
Figure 5:
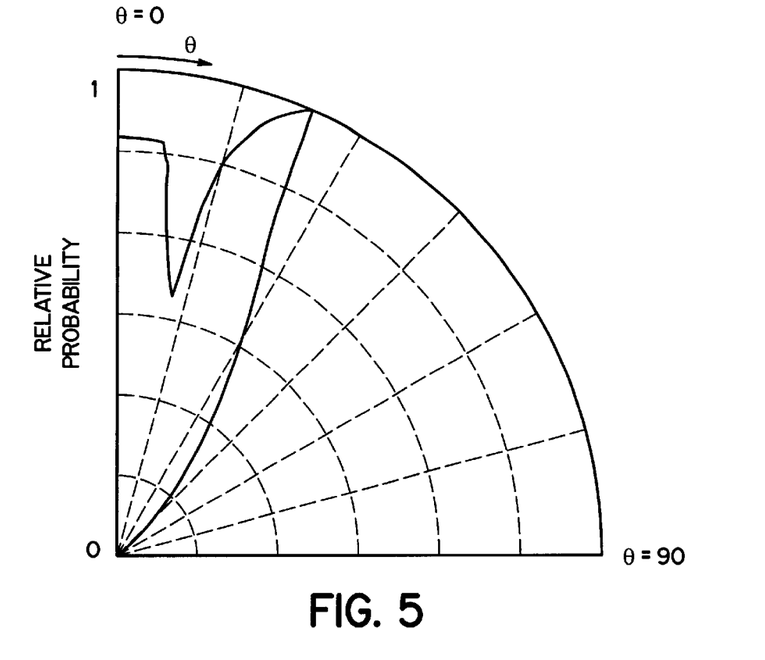
FIG. 5 is a polar plot of the angular distribution of a dual cathode PVD arrangement of the present invention at a radius of 3 cm.
Figure 6:
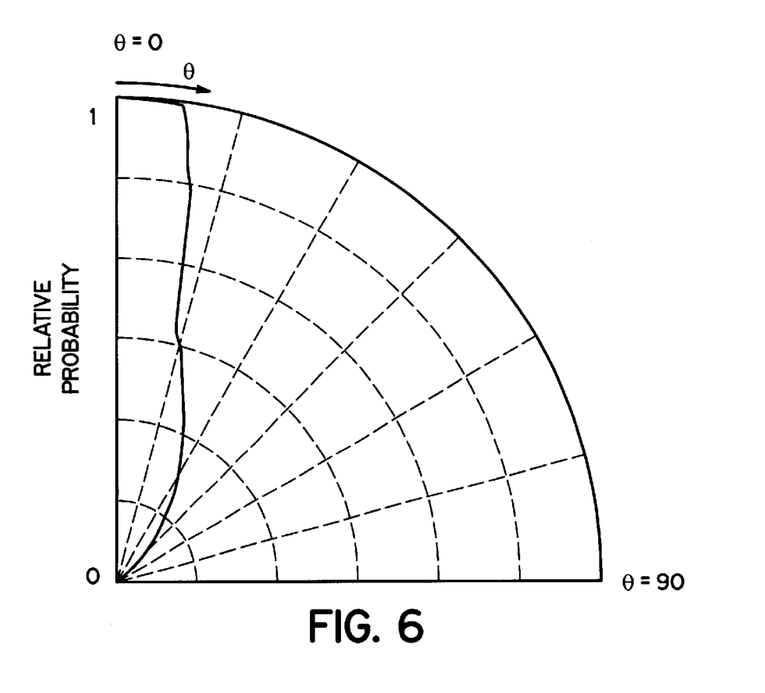
FIG. 6 is a polar plot of the angular distribution of a dual cathode PVD arrangement of the present invention at a radius of 6 cm.

To further illustrate the present invention, FIGS. 3–6 are polar plots of the angular distribution of a traditional PVD planar cathode and the dual cathode arrangement of the present invention. In the polar plot of FIG. 3, the traditional PVD planar cathode yields a "cosine-like" angular distribution. In this plot, θ represents the angle of incidence of atoms arriving at a given point on the opposing substrate, and the angle is referenced from the substrate surface normal. FIG. 4 depicts a polar plot of angular distribution for a dual cathode of the present invention at a radius of 0 cm. Essentially there are two "slices", with the inner slice being incident from the inner planar target and the outer slice due to the convex conical target. The space between the two slices results from the dead space between the two cathodes of the dual cathode arrangement. FIG. 5 depicts the polar plot of angular distribution of the dual cathode arrangement of the present invention at a radius of 3 cm from the center of the substrate. The two slices have partially merged together at this point on the substrate. FIG. 6 depicts the polar plot of the angular distribution of a dual cathode arrangement of present invention at a radius of 6 cm from the center of the substrate. At this distance, the majority of sputtered atoms are directed from the convex conical target. These plots indicate the complimentary distribution that is achieved by the dual cathode arrangement of the present invention, as compared to the cosine-like distribution from a single planar cathode.

While the present invention has been illustrated by the description of embodiments thereof, and while the embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A cathode arrangement for physical vapor deposition of a material onto an opposing round substrate having features of aspect ratio greater than 1:1, the cathode arrangement comprising:

a truncated conical target having an inner edge, an outer edge, an exterior sputtering surface, an interior surface, and a center axis adapted to be oriented collinearly with a center axis of said opposing round substrate, the exterior sputtering surface facing away from the center axis; and a planar target positioned inside an orifice at the inner edge of the conical target and having an exterior sputtering surface opposing said substrate, wherein sputtered atoms generated during physical vapor deposition from each of said targets deposit on said substrate with high flat-field uniformity.

2. The cathode arrangement of claim 1, wherein the conical target and the planar target comprise identical material.

3. The cathode arrangement of claim 1, wherein an outer diameter at the outer edge of the conical target is greater than a diameter of said substrate.

4. The cathode arrangement of claim 1, wherein the planar target is electrically isolated from the conical target.

5. The cathode arrangement of claim 1, wherein the planar target and the conical target are adapted to be driven by separate power supplies.

6. The cathode arrangement of claim 1, wherein the exterior sputtering surface of the planar target is adapted to be positioned away from said substrate at a distance of less than a diameter of said substrate.

7. The cathode arrangement of claim 1, wherein the exterior sputtering surface faces away from the center axis at an angle of about 35° to about 45° relative to a plane perpendicular to the center axis.

8. A cathode arrangement for physical vapor deposition of a material onto an opposing round substrate having features of aspect ratio greater than 1:1, the cathode arrangement comprising:

a truncated conical target having an inner edge, an outer edge, an exterior sputtering surface, an interior surface, and a center axis adapted to be oriented collinearly with a center axis of said opposing round substrate, the exterior sputtering surface facing away from the center axis;

a planar target positioned inside an orifice at the inner edge of the conical target and having an exterior sputtering surface opposing said substrate; and a pole piece and magnet arrangement positioned adjacent the interior surface of the conical target and adapted to create a magnetic tunnel over the exterior sputtering surface of the conical target during physical vapor deposition.

9. The cathode arrangement of claim 8, wherein the conical target and the planar target comprise identical material.

10. The cathode arrangement of claim 8, wherein an outer diameter at the outer edge of the conical target is greater than a diameter of said substrate.

11. The cathode arrangement of claim 8, wherein the planar target is electrically isolated from the conical target.

12. The cathode arrangement of claim 8, wherein the planar target and the conical target are adapted to be driven by separate power supplies.

13. The cathode arrangement of claim 8, wherein the exterior sputtering surface of the planar target is adapted to be positioned away from said substrate at a distance of less than a diameter of said substrate.

14. The cathode arrangement of claim 8, wherein the exterior sputtering surface of the planar target is adapted to be positioned away from said substrate at a distance of about one-half of a diameter of said substrate.

15. The cathode arrangement of claim 8, wherein the magnet arrangement comprises a first magnet row adjacent the orifice at the inner edge of the conical target oriented with its magnetic moment perpendicular to the exterior sputtering surface of the planar target, a second magnet row adjacent the outer edge of the conical target oriented with its magnetic moment perpendicular to the exterior sputtering surface of the conical target, and a third magnet row positioned between the first and second magnet rows oriented with its magnetic moment parallel to the exterior sputtering surface of the conical target.

16. The cathode arrangement of claim 15, wherein the pole piece further extends across an interior surface of the planar target, and the magnet arrangement further comprises a fourth magnet positioned at the center axis oriented with its magnetic moment perpendicular to the exterior sputtering surface of the planar target and a fifth magnet row positioned between the first magnet row and the fourth magnet and having its magnetic moment oriented parallel to the exterior sputtering surface of the planar target.

17. The cathode arrangement of claim 8, wherein the planar target includes a recessed portion on the exterior sputtering surface at an outer edge of the planar target.

18. The cathode arrangement of claim 8, wherein the exterior sputtering surface faces away from the center axis at an angle of about 35° to about 45° relative to a plane perpendicular to the center axis.

19. A cathode arrangement for physical vapor deposition of a material onto an opposing round substrate having features of aspect ratio greater than 1:1, the cathode arrangement comprising:

a truncated conical target having an inner edge, an outer edge, an exterior sputtering surface, an interior surface, and a center axis adapted to be oriented collinearly with a center axis of said opposing round substrate, the exterior sputtering surface facing away from the center axis;

a planar target comprising material identical to the material of the conical target positioned inside an orifice at the inner edge of the conical target and having an exterior sputtering surface opposing said substrate at a distance of less than a diameter of said substrate; and a pole piece and magnet arrangement positioned adjacent the interior surface of the conical target and adapted to create a magnetic tunnel over the exterior sputtering surface of the conical target during physical vapor deposition, the magnet arrangement comprising a first magnet row adjacent the orifice at the inner edge of the conical target oriented with its magnetic moment perpendicular to the exterior sputtering surface of the planar target, a second magnet row adjacent the outer edge of the conical target oriented with its magnetic moment perpendicular to the exterior sputtering surface of the conical target, and a third magnet row positioned between the first and second magnet rows oriented with its magnetic moment parallel to the exterior sputtering surface of the conical target.

20. The cathode arrangement of claim 19, wherein an outer diameter at the outer edge of the conical target is greater than a diameter of said substrate.

21. The cathode arrangement of claim 19, wherein the planar target is electrically isolated from the conical target.

22. The cathode arrangement of claim 19, wherein the planar target and the conical target are adapted to be driven by separate power supplies.

23. The cathode arrangement of claim 19, wherein the exterior sputtering surface of the planar target is adapted to be positioned away from said substrate at a distance of about one-half of a diameter of said substrate.

24. The cathode arrangement of claim 19, wherein the pole piece further extends across an interior surface of the planar target, and the magnet arrangement further comprises a fourth magnet positioned at the center axis oriented with its magnetic moment perpendicular to the exterior sputtering surface of the planar target and a fifth magnet row positioned between the first magnet row and the fourth magnet and having its magnetic moment oriented parallel to the exterior sputtering surface of the planar target.

25. The cathode arrangement of claim 19, wherein the planar target includes a recessed portion on the exterior sputtering surface at an outer edge of the planar target.

26. The cathode arrangement of claim 19, wherein the exterior sputtering surface faces away from the center axis at an angle of about 35° to about 45° relative to a plane perpendicular to the center axis.

27. A cathode arrangement for physical vapor deposition of a material onto an opposing round substrate having features of aspect ratio greater than 1:1, the cathode arrangement comprising:

a truncated conical target having an inner edge, an outer edge, an exterior sputtering surface, an interior surface, and a center axis adapted to be oriented collinearly with a center axis of said opposing round substrate, the exterior sputtering surface facing away from the center axis;

a planar target comprising material identical to the material of the conical target positioned inside an orifice at the inner edge of the conical target and having an exterior sputtering surface opposing said substrate; and a pole piece and magnet arrangement positioned adjacent the interior surface of the conical target and extending across an interior surface of the planar target, the pole piece and magnet arrangement adapted to create magnetic tunnels over the exterior sputtering surfaces of the conical target and the planar target during physical vapor deposition, the magnet arrangement comprising a first magnet row adjacent the orifice at the inner edge of the conical target oriented with its magnetic moment perpendicular to the exterior sputtering surface of the planar target, a second magnet row adjacent the outer edge of the conical target oriented with its magnetic moment perpendicular to the exterior sputtering surface of the conical target, a third magnet row positioned between the first and second magnet rows oriented with its magnetic moment parallel to the exterior sputtering surface of the conical target, a fourth magnet positioned at the center axis oriented with its magnetic moment perpendicular to the exterior sputtering surface of the planar target and a fifth magnet row positioned between the first magnet row and the fourth magnet and having its magnetic moment oriented parallel to the exterior sputtering surface of the planar target.

28. The cathode arrangement of claim 27, wherein an outer diameter at the outer edge of the conical target is greater than a diameter of said substrate.

29. The cathode arrangement of claim 27, wherein the planar target is electrically isolated from the conical target.

30. The cathode arrangement of claim 27, wherein the planar target and the conical target are adapted to be driven by separate power supplies.

31. The cathode arrangement of claim 27, wherein the exterior sputtering surface of the planar target is adapted to be positioned away from said substrate at a distance of less than a diameter of said substrate.

32. The cathode arrangement of claim 27, wherein the exterior sputtering surface of the planar target is adapted to be positioned away from said substrate at a distance of about one-half of a diameter of said substrate.

33. The cathode arrangement of claim 27, wherein the planar target includes a recessed portion on the exterior sputtering surface at an outer edge of the planar target.

34. The cathode arrangement of claim 27, wherein the exterior sputtering surface faces away from the center axis at an angle of about 35° to about 45° relative to a plane perpendicular to the center axis.

35. A method of depositing a material onto a round substrate having features of aspect ratio greater than 1:1, the method comprising:

providing a truncated conical target in opposing relation to said round substrate, the conical target having an inner edge, an outer edge, an exterior sputtering surface, an interior surface and a center axis, and orienting the conical target with its center axis collinear with a center axis of said opposing round substrate and the exterior sputtering surface facing away from the center axis;

positioning a planar target inside an orifice at the inner edge of the conical target with an exterior sputtering surface opposing said substrate; and depositing said material by physical vapor deposition from each of said targets wherein sputtered atoms generated from the exterior sputtering surfaces of said targets deposit on said substrate with high flat-field uniformity.

36. The method of claim 35, wherein the exterior sputtering surface of the planar target is positioned away from said substrate at a distance of less than a diameter of said substrate.

37. The method of claim 35, further comprising electrically isolating the planar target from the conical target.

38. The method of claim 35, further comprising driving the planar target and the conical target by separate power supplies.

39. The method of claim 35, further comprising positioning a pole piece and magnet arrangement adjacent the interior surface of the conical target and creating a magnetic tunnel over the exterior sputtering surface of the conical target during the depositing by physical vapor deposition.

40. The method of claim 39, wherein the positioning of the magnet arrangement comprises positioning a first magnet row adjacent the orifice at the inner edge of the conical target oriented with its magnetic moment perpendicular to the exterior sputtering surface of the planar target, positioning a second magnet row adjacent the outer edge of the conical target oriented with its magnetic moment perpendicular to the exterior sputtering surface of the conical target, and positioning a third magnet row between the first and second magnet rows oriented with its magnetic moment parallel to the exterior sputtering surface of the conical target.

41. The method of claim 35, further comprising positioning a pole piece and magnet arrangement adjacent the interior surface of the conical target and extending across an interior surface of the planar target and creating magnetic tunnels over the exterior sputtering surfaces of the conical target and the planar target during the depositing by physical vapor deposition.

42. The method of claim 41, wherein the positioning of the magnet arrangement comprises positioning a first magnet row adjacent the orifice at the inner edge of the conical target oriented with its magnetic moment perpendicular to the exterior sputtering surface of the planar target, positioning a second magnet row adjacent the outer edge of the conical target oriented with its magnetic moment perpendicular to the exterior sputtering surface of the conical target, positioning a third magnet row between the first and second magnet rows oriented with its magnetic moment parallel to the exterior sputtering surface of the conical target, positioning a fourth magnet at the center axis oriented with its magnetic moment perpendicular to the exterior sputtering surface of the planar target and positioning a fifth magnet row between the first magnet row and the fourth magnet and having its magnetic moment oriented parallel to the exterior sputtering surface of the planar target.

* * * * *

UNITED STATES PATENT AND TRADEMARK OFFICE
CERTIFICATE OF CORRECTION

PATENT NO. : 6,277,250 B1  
DATED : August 21, 2000  
INVENTOR(S) : Russell et al.

Page 1 of 1

It is certified that error appears in the above-identified patent and that said Letters Patent is hereby corrected as shown below:

Column 3,
Line 14 reads "PVD arrangement of the" and should read -- PVD arrangement 10 of the --.

Column 4,
Lines 18 and 19 should not start a new paragraph.
Line 37 reads "12 inch target" and should read -- 12 inch substrate --.

Column 5,
Lines 29 and 30 should not start a new paragraph.
Line 46 reads "17,31" and should read -- 31 --.

Column 6,
Line 19 reads "arrangement of present invention" and should read -- arrangement of the present invention --.
Line 22 reads "complimentary" and should read -- complementary --.
Line 36 reads "applicant's" and should read -- applicants' --.

Signed and Sealed this

Twenty-eighth Day of May, 2002

Attest:

*Attesting Officer*

JAMES E. ROGAN
*Director of the United States Patent and Trademark Office*